United States Patent [19]
Kao et al.

[11] Patent Number: 5,774,648
[45] Date of Patent: Jun. 30, 1998

[54] ADDRESS GENERATOR FOR ERROR CONTROL SYSTEM

[75] Inventors: Rom-Shen Kao; Vickie L. Gibbs, both of Durham, N.C.

[73] Assignee: Mitsubishi Semiconductor of America, Inc., Durham, N.C.

[21] Appl. No.: 725,685

[22] Filed: Oct. 2, 1996

[51] Int. Cl.$^6$ .................................................. G06F 11/10
[52] U.S. Cl. ................... 395/185.01; 395/182.04; 371/40.1; 371/37.1
[58] Field of Search ................... 395/185.01, 182.04; 371/40.1, 37.1, 37.5, 37.7

[56] References Cited

U.S. PATENT DOCUMENTS

| | | | |
|---|---|---|---|
| 4,092,713 | 5/1978 | Scheuneman | 395/185.06 |
| 4,413,339 | 11/1983 | Riggle et al. | 371/40.1 |
| 4,438,512 | 3/1984 | Hartung et al. | 395/185.02 |
| 4,498,175 | 2/1985 | Nagumo | 371/37.5 |
| 4,567,594 | 1/1986 | Deodhar | 371/38 |
| 4,633,471 | 12/1986 | Perera et al. | 371/38 |
| 4,637,021 | 1/1987 | Shenton | 371/37.5 |
| 4,727,547 | 2/1988 | Brandes | 371/38 |
| 4,777,635 | 10/1988 | Glover | 371/40 |
| 4,788,685 | 11/1988 | Sako et al. | 371/38 |
| 4,868,828 | 9/1989 | Shao et al. | 371/5.1 |
| 4,890,287 | 12/1989 | Johnson et al. | 371/37.2 |
| 4,901,318 | 2/1990 | Tomisawa | 371/40.1 |
| 4,905,242 | 2/1990 | Popp | 371/40.1 |
| 4,918,692 | 4/1990 | Hidaka et al. | 371/2.2 |
| 4,947,396 | 8/1990 | Shin et al. | 371/40.1 |
| 4,949,342 | 8/1990 | Shimbo et al. | 371/40.1 |
| 4,975,915 | 12/1990 | Sako et al. | 371/37.4 |
| 4,989,210 | 1/1991 | Scheuneman et al. | 371/40.1 |
| 5,058,116 | 10/1991 | Chao et al. | 371/40.2 |
| 5,091,910 | 2/1992 | Ochi | 371/40.1 |
| 5,107,503 | 4/1992 | Riggle et al. | 371/37.1 |
| 5,241,546 | 8/1993 | Peterson et al. | 371/37.1 |
| 5,247,629 | 9/1993 | Casamatta et al. | 395/400 |
| 5,285,451 | 2/1994 | Henson et al. | 395/182.04 |
| 5,313,624 | 5/1994 | Harriman et al. | 395/182.04 |
| 5,383,204 | 1/1995 | Gibbs et al. | 371/37.7 |
| 5,440,571 | 8/1995 | Mok | 371/40.1 |
| 5,627,844 | 5/1997 | Cho | 371/40.1 |

*Primary Examiner*—Ly Hua
*Attorney, Agent, or Firm*—Lowe, Price, LeBlanc & Becker

[57] ABSTRACT

An address generator provided on an error control chip of an optical disk storage for addressing a plurality of working buffers accessed by a CPU, an optical disk drive (ODD), and encoder/decoder circuitry during error correction operations. The address generator comprises a loading address generator that produces an adop address signal to provide linear buffer access for the CPU and ODD when data are supplied from and to the CPU and ODD for encoding and decoding. A processing address generator produces an adex address signal that provides interleaving and random buffer access for the encoder/decoder circuitry during data encoding and decoding operations. A buffer rotation control circuit produces address and data bus control signals to provide the rotation of the buffers between the CPU, ODD, and encoder/decoder circuitry in various encoding and decoding cycles to support a pipeline error control arrangement.

24 Claims, 15 Drawing Sheets

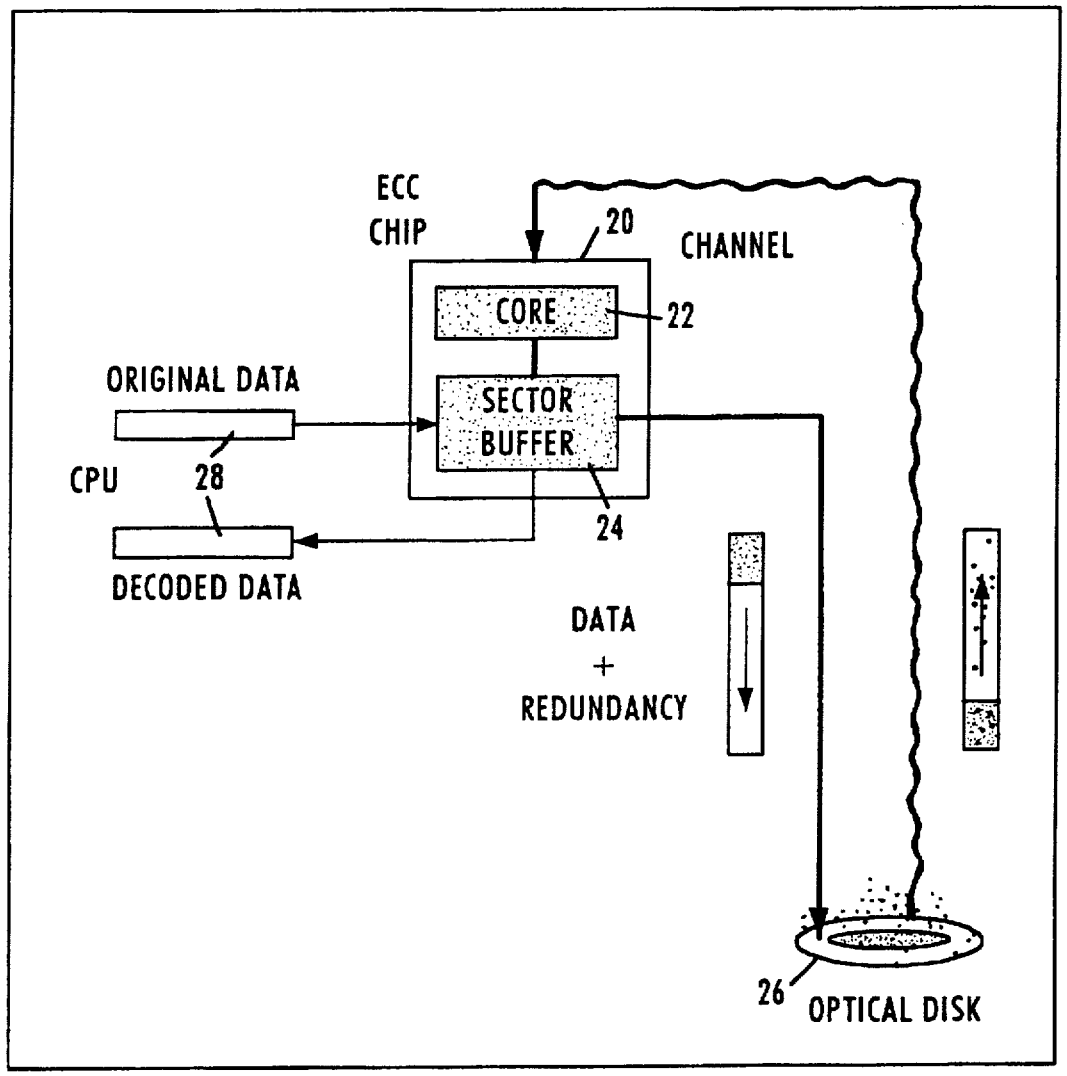
Figure 1 (BACKGROUND)

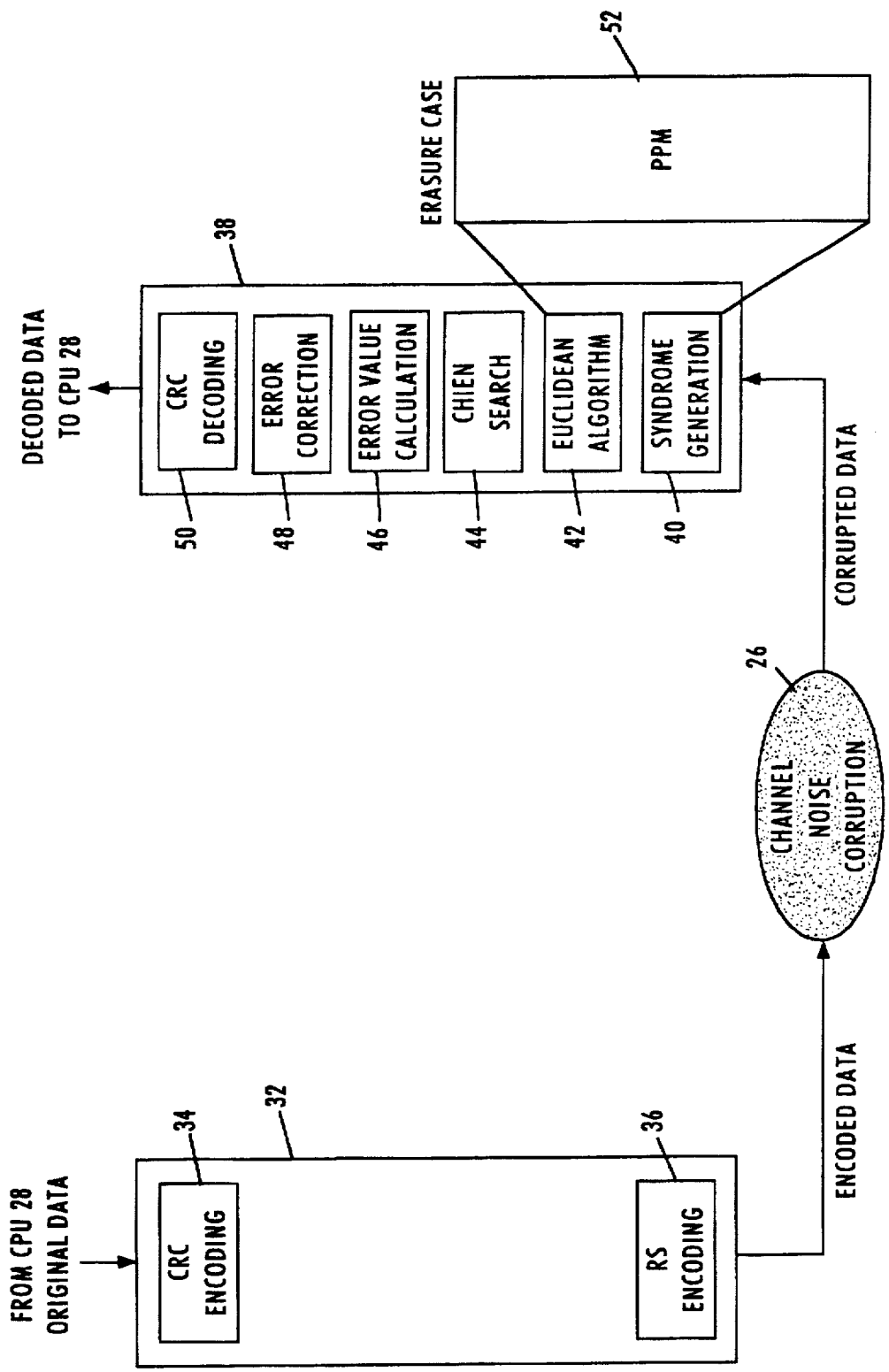
Figure 2 (BACKGROUND)

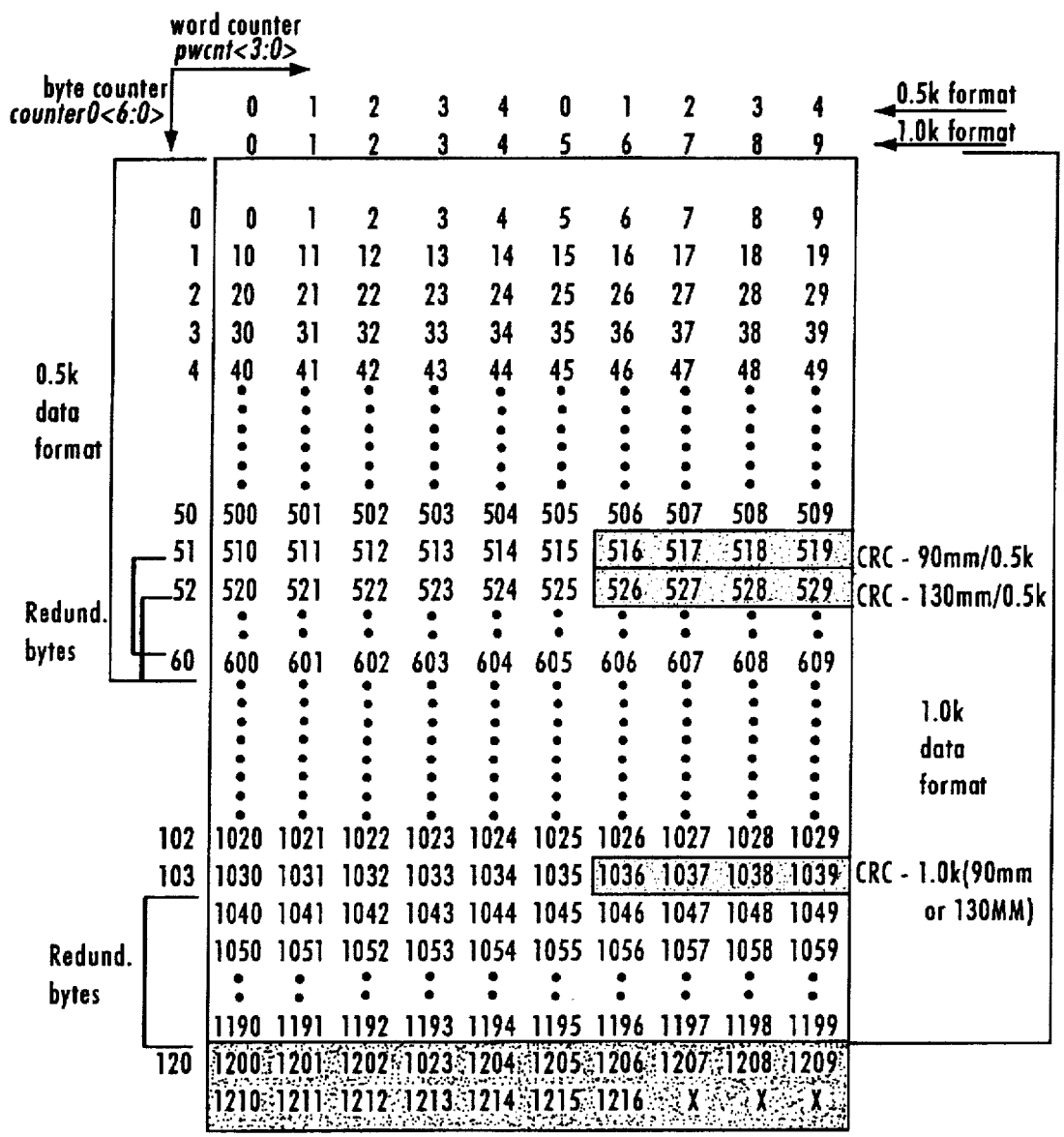
Figure 3 (BACKGROUND)
☐ ORIGINAL CODEWORDS
▨ ERASURE LOCATION STORAGE
▒ CRC BYTES
X  DON'T CARE Figure 4 (BACKGROUND)

| MAPPING FUNCTION (input to address generator) pwcnt | 0 | 1 | 2 | 3 | 4 | 5 | 6 | 7 | 8 | 9 | 10 | 11 | 12 | 13 |
|---|---|---|---|---|---|---|---|---|---|---|---|---|---|---|
| wdcnt(1.0) | 0 | 1 | 2 | 3 | 4 | 5 | 6 | 7 | 8 | 9 | 6 | 7 | 8 | 9 |
| wdcnt(0.5) | 0 | 1 | 2 | 3 | 4 | 1 | 2 | 3 | 4 | 5 | 6 | 7 | 8 | 9 |
| wdcorr | 0 | 0 | 0 | 0 | 1 | 2 | 3 | 4 | 5 | 6 | 7 | 8 | 9 | |

| ENCODE/ DECODE | ROTATION COUNTER | SA0 | SA1 | SA2 |
|---|---|---|---|---|
| 1 (ENC) | 0 | CPU (adop) | ODD (adop) | ECC (adex) |
| | 1 | ECC (adex) | CPU (adop) | ODD (adop) |
| | 2 | ODD (adop) | ECC (adex) | CPU (adop) |
| 0 (DEC) | 0 | CPU (adop) | ODD (adop) | ECC (adex) |
| | 1 | ODD (adop) | ECC (adex) | CPU (adop) |
| | 2 | ECC (adex) | CPU (adop) | ODD (adop) |

Figure 17

| ENCODE/ DECODE | ROTATION COUNTER | SD0 | SD1 | SD2 |
|---|---|---|---|---|
| 1 (ENC) | 0 | CPU (0) | ODD (1) | ECC (2) |
| | 1 | ECC (2) | CPU (0) | ODD (1) |
| | 2 | ODD (1) | ECC (2) | CPU (0) |
| 0 (DEC) | 0 | CPU (0) | ODD (1) | ECC (2) |
| | 1 | ODD (1) | ECC (2) | CPU (0) |
| | 2 | ECC (2) | CPU (0) | ODD (1) |

Figure 18

ADDRESS GENERATOR FOR ERROR CONTROL SYSTEM

TECHNICAL FIELD

The present invention relates generally to error correction, and more particularly, to an address generator that supports operations of an error correction system for an optical disk storage.

BACKGROUND ART

Since a storage medium is subject to various types of noise, distortion and interference, various errors can occur at its output, including erasure of written data. The massive amount of digital data stored in an optical disk storage increases the probability of errors and erasures. To correct errors and erasures, an optical disk storage is provided with an error control chip (ECC). Reference is now made to FIG. 1, wherein the error control chip 20 comprises a core 22 and a sector buffer 24 for storing data corresponding to a sector of an optical disk 26. Original data to be written onto the optical disk 26 are supplied from a CPU 28 to the sector buffer 24. An encoder in the core 22 transforms the original data into code words including data bytes and redundant bytes. Through the sector buffer 24, the code words are written onto the optical disk 26. In a reading mode, the code words through the sector buffer 24 are supplied to a decoder in the core 22. The decoded data are transferred to the CPU 28 via the sector buffer 24.

In optical disk applications, the code words are encoded based on International Standard Organization (ISO) Standard that requires Cyclic Redundancy Check (CRC) encoding and incorporates a Reed-Solomon (RS) code over some Galois fields. The RS (n,k) code is a cyclic symbol error-correcting code where k symbols of an original data are encoded. The result, which is an (n-k) symbol redundancy block, is appended to the data. The Galois field is a finite field, the elements of which may be represented as polynomials with particular primitive elements as variables. The RS code represents a block sequence of a Galois field $GF(2^m)$ of $2^m$ binary symbols, where m is the number of bits per symbol. Constructing the Galois field $GF(2^m)$ requires a generator polynomial $p(x)$ of degree m and a primitive element $\beta$, which is a root of $p(x)$. The powers of $\beta$ generate all nonzero elements of $GF(2^m)$.

As shown in FIG. 2, the core 22 comprises an encoder 32 having a CRC encoding circuit 34 and an RS encoding circuit 36. The encoder 32 generates, in k steps, (n-k) redundancy bytes, which are appended to the original code data to make a n-byte code word written on the optical disk 50 26. A decoder 38 of the core 20 comprises a syndrome generator 40, which detects errors and generates syndrome bytes $S(x)$ for each word of corrupted data received from the optical disk 26. The syndrome (n-k) bytes are supplied to an Euclidean operation circuit 42, which finds an error location polynomial $\sigma(x)$ and error value polynomial $\eta(x)$ using an extended Euclidean algorithm. The Euclidean operation circuit 42 is connected to an error locating circuit 44, which uses the Chien Search process to find actual error locations based on the error location polynomial $\sigma(x)$. The error locations, together with the error value polynomial $\eta(x)$ and error location polynomial $\sigma(x)$, are used by an error value calculator 46 to determine error value at each error location found by the Chien Search process. An error correcting circuit 48 uses known error locations and values to correct the errors. A CRC decoding circuit 50 performs CRC decoding and supplies the decoded data to the CPU 28.

If the corrupted data includes erasures, the decoder 38 performs polynomial expansion to find erasure polynomial based on known erasure locations. Module polynomial multiplication is carried out to calculate modified syndrome polynomial used in regular polynomial multiplication to obtain erasure/error location polynomial. To perform these polynomial operations, the decoder 38 may include a polynomial processing module (PPM) 52 disclosed in more detail in copending U.S. patent application Ser. No 08/192, 909, entitled "FINITE FIELD POLYNOMIAL PROCESSING MODULE FOR ERROR CONTROL CODING" filed Feb. 7, 1994 and incorporated herewith by reference.

As discussed above, the sector buffer 24 stores original data supplied from the CPU 28 for encoding, data encoded by the encoder 32 for writing onto the disk 26, corrupted data supplied from the disk 26 for decoding, and data decoded by the decoder 38 for transferring to the CPU 28. Hence, the CPU 28, an optical disk drive (ODD) that performs reading and writing from and to the optical disk 26, the encoder 32 and the decoder 38 should be provided with a separate access to the sector buffer.

An example of conventional data organization of the sector buffer 24 for various formats of the optical disk 26 is shown in FIG. 3. Four optical disk formats are represented. The 90 mm/0.5K and 130 mm/0.5K formats respectively define a 90 mm (3 ½ inch) disk with 520 bytes (0.5K) per sector, and a 130 mm (5 ¼ inch) disk with 530 bytes (0.5 per sector. The 90 mm/1K and 130 mm/1K formats respectively define a 90 mm disk with 1024 bytes (1K) per sector, and a 130 mm disk with 1024 bytes (1K) per sector.

For the 90 mm/1K and 130 mm/1K formats, the sector buffer 24 is organized as 120 bytes (in the vertical direction) by 10 words (in the horizontal direction), of which the last 16 bytes in each word are redundant.

For the 130 mm/0.5K format, the sector buffer 24 is organized as 61 bytes (in the vertical direction) by 5 words (in the horizontal direction), of which the last 16 bytes in each word are redundant.

For the 90 mm/0.5K format, the sector buffer 24 is organized as 60 bytes (in the vertical direction) by 5 words (in the horizontal direction), of which the last 16 bytes in each word are redundant. Erasure location bytes are stored in buffer locations 1200 to 1216 for all formats.

As shown in FIG. 3, for the 90 mm/1K and 130 mm/1K formats, the CRC bytes are stored in locations 1036, 1037, 1038 and 1039. For the 90 mm/0.5K and 130 mm/0.5K formats, locations 516–519 and 526–529, respectively, are designated for the CRC bytes.

Three different access scheme are required for the sector buffer 24. Linear access to each byte of each codeword should be provided to support interfaces with the CPU 28 and the disk 26, and for loading the erasure locations. For correction of errors, each location of the buffer should be accessible randomly, because the correction circuitry must be able to access the determined error location to correct the error. To support CRC and RS encoding and decoding, codewords may be accessed in an interleaving manner when data is written to the sector buffer from the CPU or disk in one direction, and read by the error correction circuitry in a different direction.

As illustrated in FIG. 4, to increase the throughput of the error correction system, the decoding modules can be arranged into a pipeline to operate on different codewords (CW0–CW9) in the sector buffer 24, simultaneously. The pipeline architecture involves the following decoding operations: syndrome generation/CRC decoding (SYN/CRC1), PPM polynomial operations, Chien search (CHN), error value calculation (EVL), error correction (COR) and final steps of CRC decoding (CRC2). The pipeline mode requires different codewords in the sector buffer 24 to be accessible by different decoding modules simultaneously. As the access time cannot overlap, addressing should be multiplexed so as to provide any module with the required access at any time.

Therefore, it would be desirable to provide a unified addressing system that allows the sector buffer access for data encoding and decoding, supports various optical disk formats and error control modes, and enables the error correction system to operate in the pipeline mode.

Also, to provide an error correction pipeline arrangement with simultaneous processing capabilities, it would be desirable to incorporate multiple buffer memories, each of which provides storage space for data corresponding to a sector of an optical disk. For example, one buffer memory may be used for interfacing to an ODD, another buffer memory may provide an interface to a CPU, and the third buffer memory may be coupled to encoding and decoding units. An addressing system is needed to access the multiple data buffers during an error correction procedure.

DISCLOSURE OF THE INVENTION

Accordingly, one advantage of the invention is in providing a unified addressing system that allows a CPU, an ODD, and encoding and decoding modules to access a sector buffer for data encoding and decoding.

Another advantage of the invention is in providing an addressing system that supports error corrections for various optical disk formats.

A further advantage of the invention is in providing an addressing system that supports a pipeline mode of error correction.

Another advantage of the invention is in providing an addressing system that allows multiple data buffers to be accessed during an error correction procedure.

A further advantage of the invention is in providing an addressing system that allows errors and erasures to be corrected.

Another advantage of the invention is in providing an address generator for supplying addresses used to access a sector buffer for data encoding and decoding.

The above and other advantages of the invention are achieved, at least in part by providing a system for correcting errors in a disk storage that comprises an encoder for encoding original data supplied from a central processor for storing in the disk storage, and a decoder for decoding data read by a disk drive from the disk storage. A plurality of working buffers is provided to store intermediate results of encoding and decoding. An address generator is used for addressing the plurality of working buffers to enable the central processor, disk drive, encoder and decoder to access a predetermined one of the plurality of working buffers.

In accordance with a first aspect of the invention, the address generator comprises a buffer rotation circuit for rotating the plurality of working buffers to allow the central processor, disk drive, encoder and decoder to sequentially access all of the plurality of working buffers.

In accordance with another aspect of the invention, the address generator comprises a loading address generator for providing the central processor and disk drive with linear access to the locations of the working buffers.

In accordance with a further aspect of the invention, the address generator further comprises a processing address generator for providing the encoder and decoder with interleaving and random access to locations of the working buffers.

Preferably, the working buffers are coupled to an output of an address multiplexing circuit that includes a plurality of address multiplexers. A first input of each address multiplexer may be connected to the loading address generator, and a second input of each address multiplexers may be connected to the processing address generator. The address multiplexers may be controlled by the buffer rotation circuit.

Also, the working buffers may be connected to inputs of a data bus multiplexing circuit having outputs coupled to the central processor, disk drive, encoder and decoder. The data bus multiplexing circuit may be controlled by the buffer rotation circuit.

The buffer rotation circuit may comprise a plurality of comparators supplied by rotation counts and an encoding/decoding select signal.

In accordance with a method of the present invention, the following steps are carried out for data encoding:
- supplying a first working buffer with a first data block to be encoded,
- encoding a second data block stored in a second working buffer,
- outputting an encoded third data block stored in a third working buffer,
- rotating the first, second and third working buffers for supplying the third working buffer with a fourth data block to be encoded, encoding the first data block stored in the first working buffer, and outputting the encoded second data block from the second working buffer, and
- further rotating the first, second and third working buffers for supplying the second working buffer with a fifth data block to be encoded, encoding the fourth data block stored in the third working buffer, and outputting the encoded first data block from the first working buffer.

In accordance with a method of the present invention, the following steps are carried out for data decoding:
- supplying a first working buffer with a first data block to be decoded,
- decoding a second data block stored in a second working buffer,
- outputting a decoded third data block stored in a third working buffer,
- rotating the first, second and third working buffers for supplying the third working buffer with a fourth data block to be decoded, decoding the first data block stored in the first working buffer, and outputting the decoded second data block from the second working buffer, and
- further rotating the first, second and third working buffers for supplying the second working buffer with a fifth data block to be decoded, decoding the fourth data block stored in the third working buffer, and outputting the decoded first data block from the first working buffer.

Still other objects and advantages of the present invention will become readily apparent to those skilled in this art from the following detailed description, wherein only the preferred embodiment of the invention is shown and described, simply by way of illustration of the best mode contemplated of carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF DRAWINGS

FIG. 1 is a diagram illustrating an error correction procedure in an optical disk storage.

FIG. 2 is a diagram illustrating data encoding and decoding in an optical disk storage.

FIG. 3 is a diagram showing sector buffer memory organization for various optical disk formats.

FIG. 4 is a diagram illustrating pipeline processing in an error correction system.

FIG. 17 is a table illustrating values of address control signals.

FIG. 18 is a table illustrating values of data bus control signals.

BEST MODE FOR CARRYING OUT THE INVENTION

Figure 4:
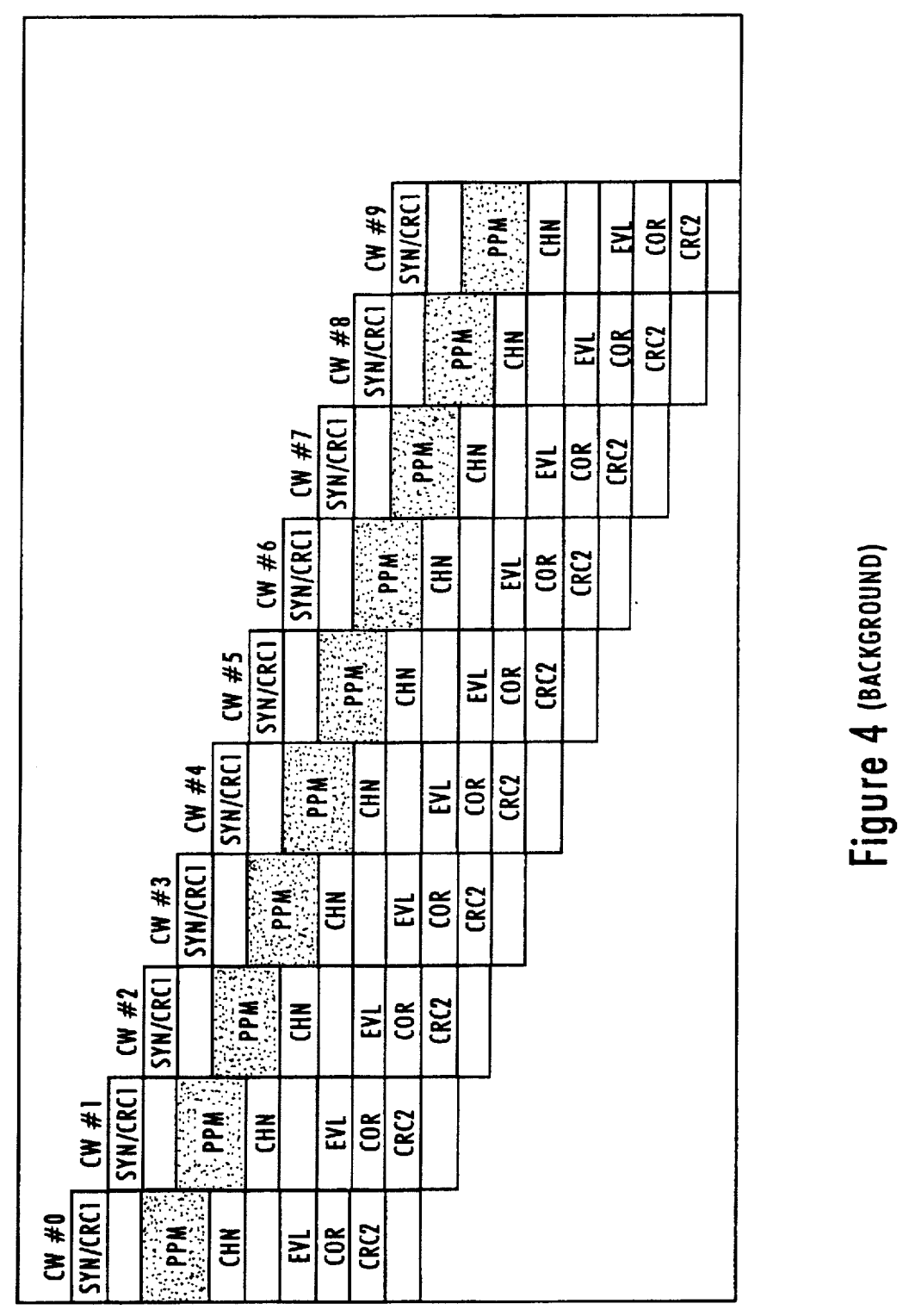
Figure 5:
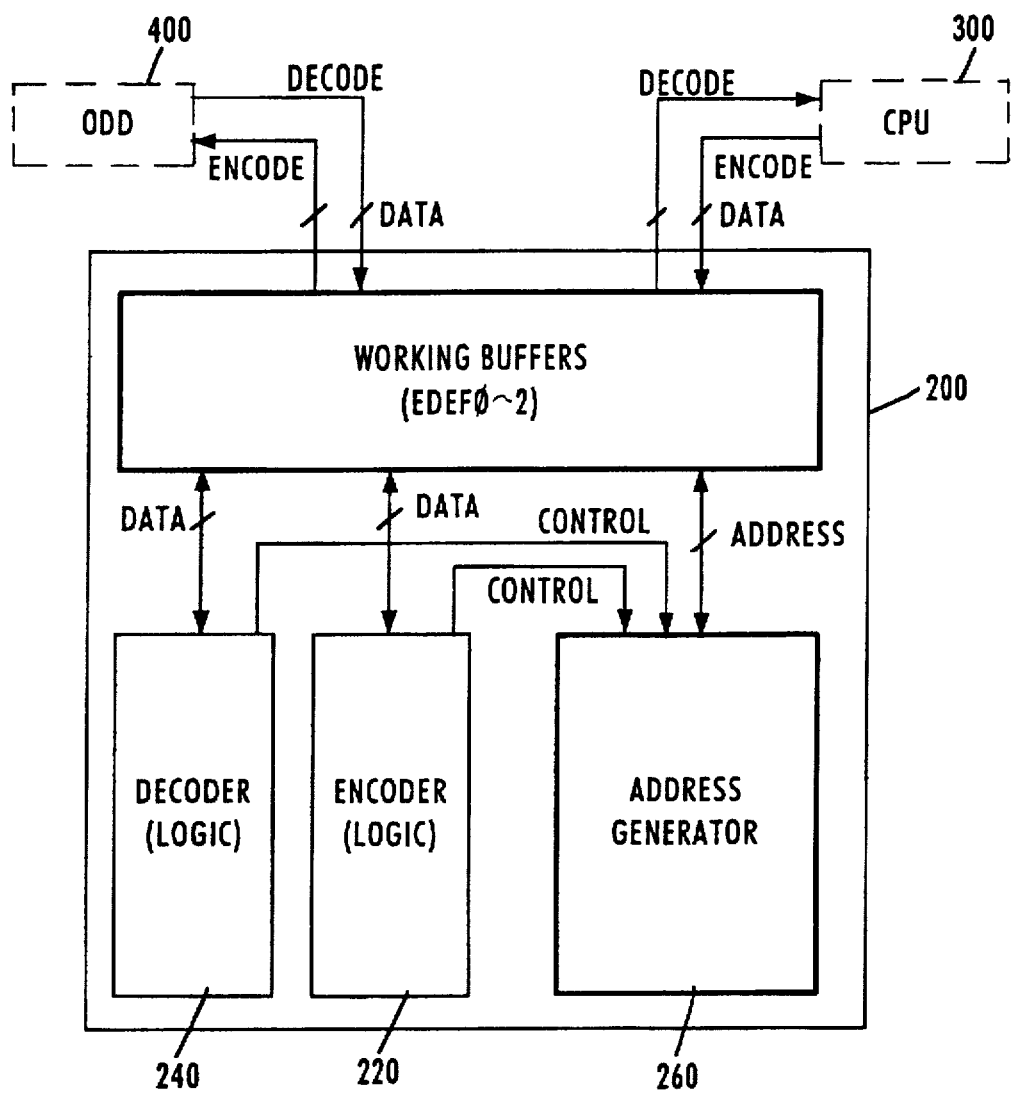
FIG. 5 is a block diagram showing a multiple buffer ECC arrangement of the present invention.

The best mode for practicing the invention is based on the realization of an error correction system with multiple data buffers for providing pipeline data processing. Referring to FIG. 5, an error control chip (ECC) 200 of the present invention comprises three working buffers EDBF0, EDBF1, and EDBF2 that interface the ECC 200 to a central processing unit (CPU) 300 and an optical disk drive (ODD) 400. Also, the working buffers EDBF0–EDBF2 communicate with an encoder 220, and a decoder 240 arranged on the ECC 200. The encoder 220 and decoder 240 may be implemented by encoding/decoding circuitry that incorporates the CRC encoder 34, RS encoder 36, syndrome generator 40, Euclidean operation circuit 42, Chien error locating circuit 44, error value calculator 46, error correcting circuit 48 and CRC decoding circuit 50 shown in FIG. 2. An address generator 260 on the ECC 200 generates address information that allows the working buffers EDBF0–EDBF2 to be accessed during data encoding and decoding to support pipeline data processing illustrated in FIG. 4. The address generator 260 will be discussed in more detail later.

Figure 6:
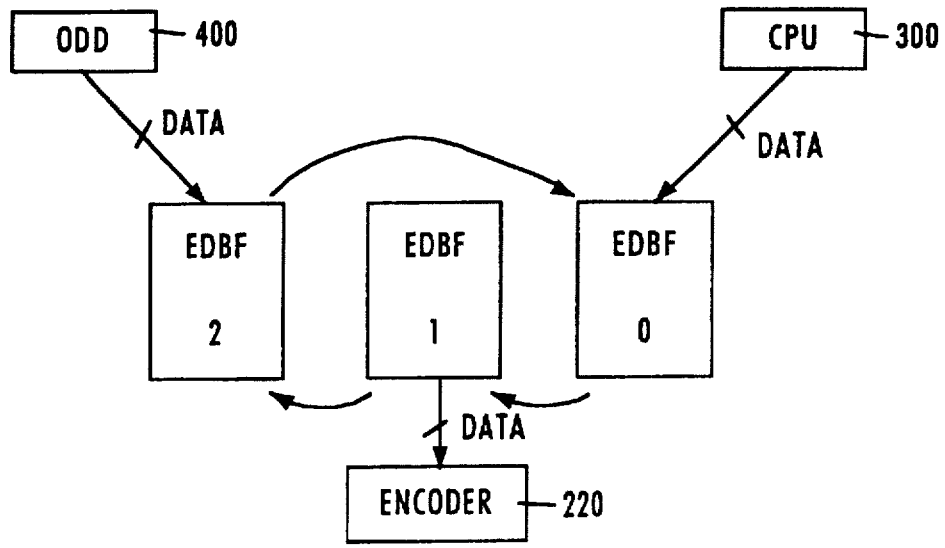
FIG. 6 is a diagram illustration buffer rotation during encoding.

As shown in FIG. 6, during a data encoding procedure, original data to be written in a sector of an optical disk may be supplied from the CPU 300, for example, to the buffer EDBF0. At the same time, the buffer EDBF1, that contains data for another disk sector provided by the CPU 300 in the previous cycle of encoding, is accessed by the encoder 220 to provide RS and CRC encoding of these data. Simultaneously, the buffer EDBF2, that stores the sector data encoded by the encoder 220 in the previous encoding cycle, sends these data to the ODD 400 for writing onto the optical disk.

When the CPU 300 is ready to supply data for the next optical disk sector, the working buffers rotate. The buffer EDBF2 is switched to the CPU 300 for receiving original data for the next data sector. The buffer EDBF0 is switched to the encoder 220 to encode the sector data received in the previous cycle. The buffer EDBF1 is switched to the ODD 400 to output the encoded sector data for writing onto the optical disk.

In the next cycle of encoding, the buffer EDBF1 is switched to the CPU 300, the buffer EDBF2 is switched to the encoder 220, and the buffer EDBF0 is switched to the ODD 400. Thus, the rotation of the working buffers is carried out each time when original data for a next optical disk sector are supplied from the CPU 300 for encoding.

Figure 7:
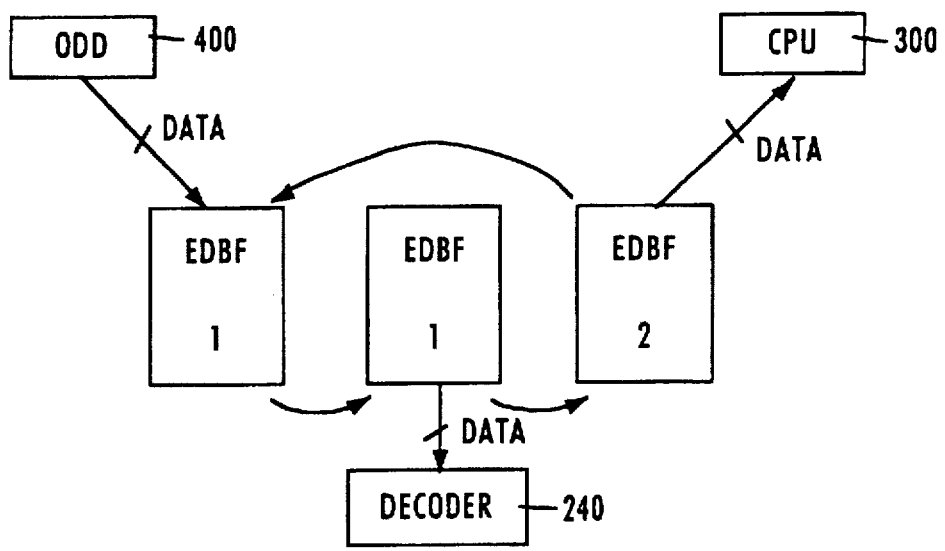
FIG. 7 is a diagram illustrating buffer rotation during decoding.

Reference is now made to FIG. 7 that illustrates working buffers rotation during a decoding procedure. For example in a first cycle of decoding, the ODD 400 writes corrupted data from an optical disk sector to the buffer EDBF0. At the same time, the buffer EDBF1, that contains the sector data written in the previous cycle of decoding, is coupled to the decoder 240 for decoding the data. The buffer EDBF2 is connected to the CPU 300 to supply it with the sector data decoded by the decoder 240 in the previous decoding cycle.

In the next decoding cycle, the buffer EDBF0 is switched to the decoder 240 for decoding the sector data received in the previous decoding cycle. The buffer EDBF1 is switched to the CPU 300 to transmit the sector data decoded in the previous decoding cycle. The buffer EDBF2 is switched to the ODD 400 to receive data from a next sector on the optical disk. The rotation procedure is carried out for data read out from each sector of the optical disk.

Thus, the ECC 200 with three working buffers provides pipeline processing of data for three sectors of the optical disk simultaneously. For example, when data to be written in sector n of the disk are supplied from the CPU 300 for encoding, data for sector n-1 are encoded, and data for sector n-2 are provided to the ODD 400. Similarly, when data read out from sector n of the disk are supplied from the ODD 400 for decoding, data from sector n-1 are decoded, and data from sector n-2 are supplied to the CPU 300. Accordingly, such an multiple-buffer error control arrangement is three times more efficient than a one-buffer error control system.

Each of the working buffers EDBF0–EDBF2 has fixed size equal to 1220 bytes (122 bytes by 10 words). The error control chip 200 may support various optical disk formats described above in connection with FIG. 3, including 130 mm/1K, 90 mm/1K, 130 mm/0.5K and 90mm/0.5K. For each of these optical disk formats, data in each of the working buffers may be arranged similarly to the corresponding data arrangements shown in FIG. 3.

Figure 8:
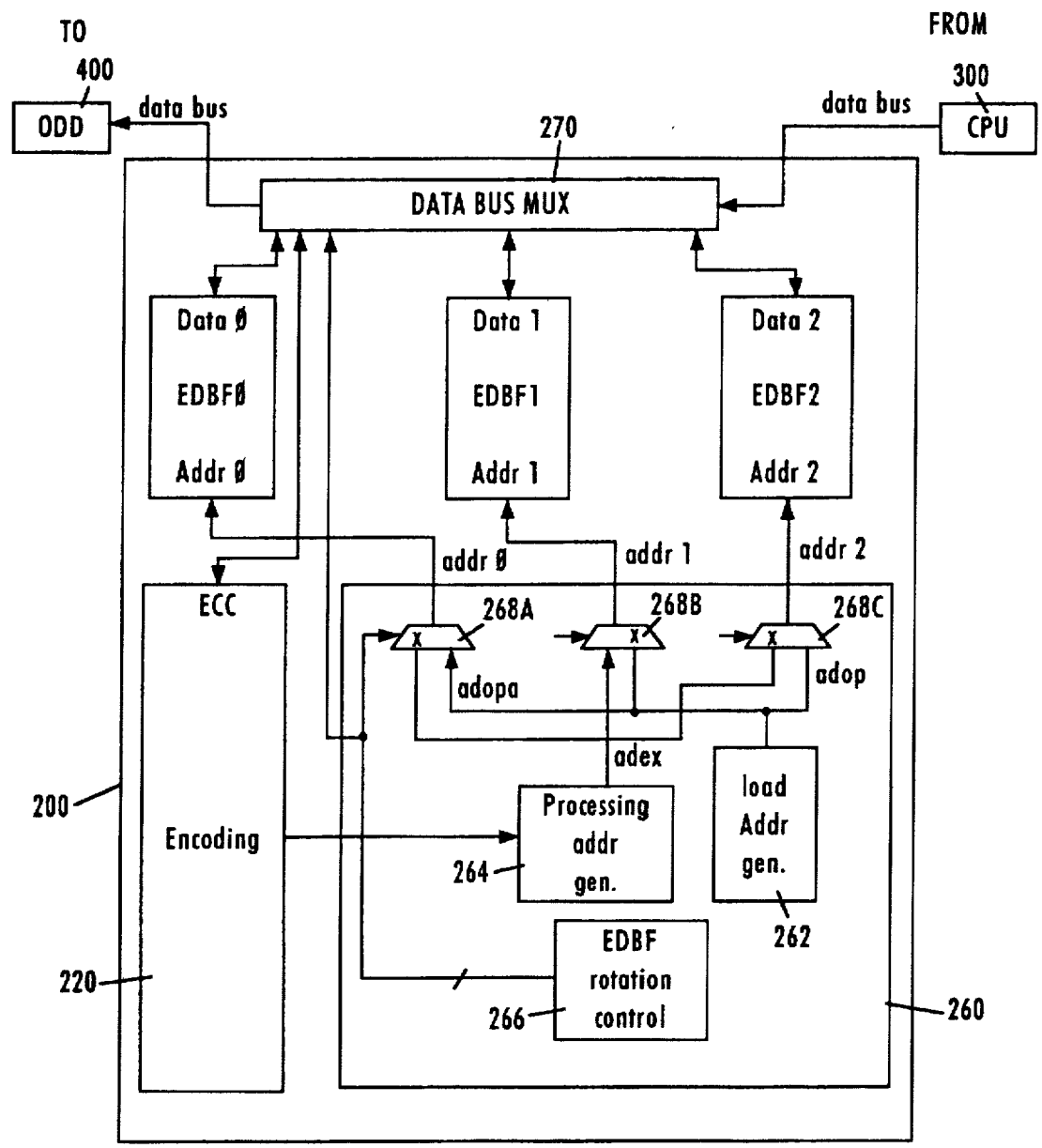
FIG. 8 is a block diagram illustrating ECC operations during encoding.
Figure 9:
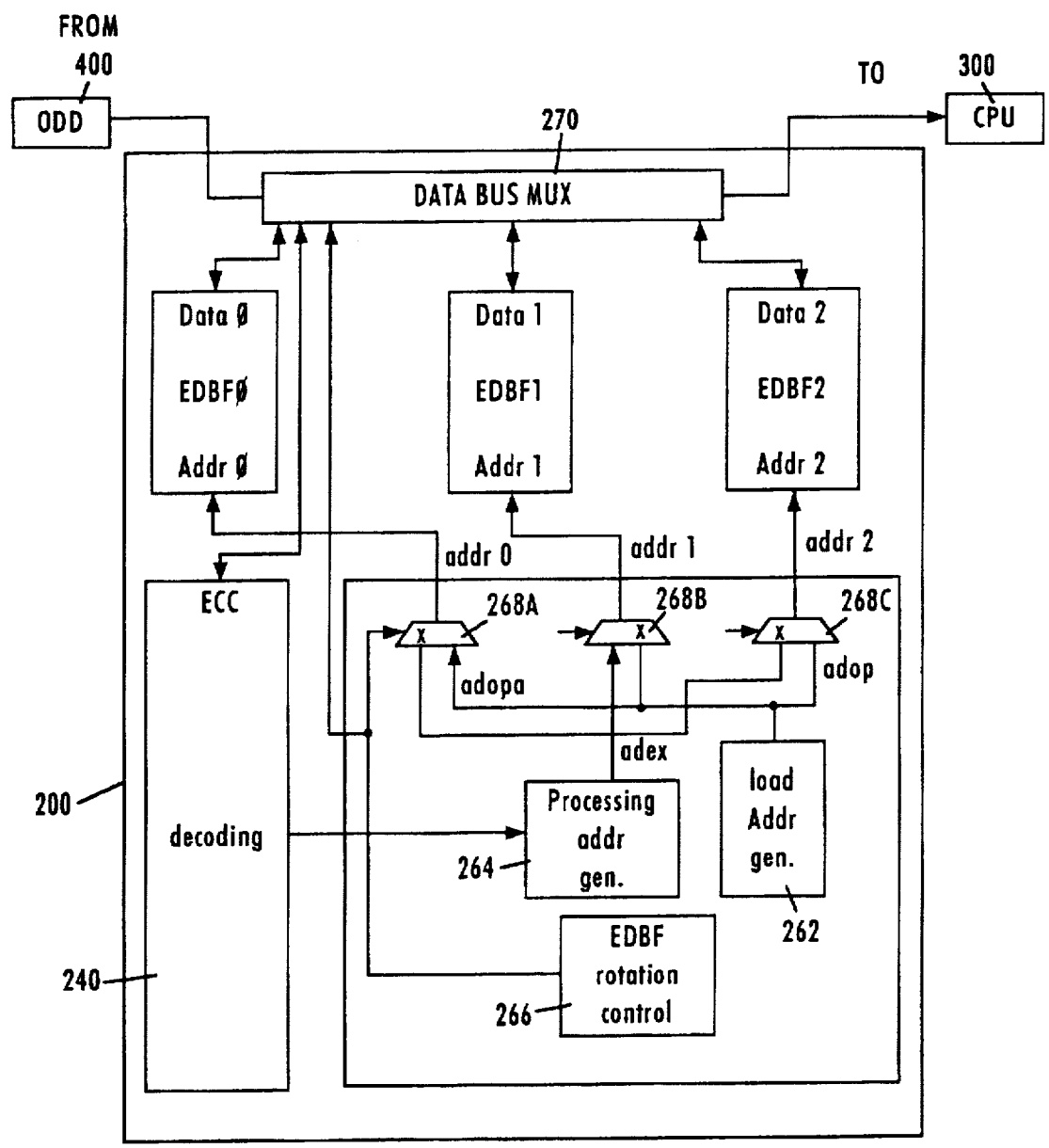
FIG. 9 is a block diagram illustrating ECC operations during decoding.

Reference is now made to FIGS. 8 and 9 that respectively illustrate the operation of the ECC 200 during an encoding procedure. The address generator 260 comprises a loading address generator 262, a processing address generator 264 and an EDBF rotation control circuit 266. The loading address generator 262 generates an adop address signal that indicates locations in the buffers EDBF0–EDBF2 to be accessed by the CPU 300 and ODD 400. The processing address generator 264 generates an adex address signal that indicates locations in the buffers EDBF0–EDBF2 to be accessed by the encoder 220 and decoder 240. The adex and adop address signals are supplied to the buffers EDBF0, EDBF1 and EDBF2 via address multiplexers 268A, 268B and 268C, respectively. The adex address signal is provided on first inputs of the address multiplexers 380A–380C, whereas the adop address signal is supplied to second inputs of the address multiplexers 268A–268C. The address multiplexers 268A, 268B, and 268C respectively output an addr0 signal, an addr1 signal, and an addr2 signal to indicate an address in the buffers EDBF0, EDBF1 and EDBF2 to be accessed by the CPU 300, ODD 400, or encoder/decoder logic 220 and 240. The EDBF rotation control circuit 266 controls each of the address multiplexers 268A–268C to supply the buffers EDBF0–EDBF2 with the corresponding address signal to provide their rotation during encoding and decoding procedures. A data bus multiplexing circuit 270 controlled by the EDBF rotation control circuit 266 couples the buffers EDBF0–EDBF2 to the CPU 300, ODD 400, encoder 220 and decoder 240. The structure and operation of the EDBF rotation control circuit 266 are discussed in more detail later.

FIG. 8 illustrates an exemplary encoding cycle when the buffer EDBF2 is supplied by the multiplexer 268C with the addr2 signal to connect this buffer to the CPU 300 for receiving data to be encoded in the next encoding cycle. The multiplexer 268B supplies the buffer EDBF1 with the addr1 signal to provide its connection to the encoder 220 for encoding data stored in this buffer. The multiplexer 268A supplies the buffer EDBF0 with the addr0 signal to transmit the data encoded in the previous encoding cycle from the buffer EDBF0 to the ODD 400. In the next cycle of encoding, the buffer EDBF1 will be connected to the ODD 400, the EDBF2 will be connected to the encoder 220, and the EDBF0 will be coupled to the CPU 300. Thereafter, EDBF2, EDBF0 and EDBF1 will be respectively connected to the ODD 400, encoder 220 and CPU 300.

FIG. 9 illustrates a decoding cycle when the buffer EDBF0 is supplied with the addr0 signal to receive from the ODD 400 data to be decoded in the next decoding cycle. The buffer EDBF1 is supplied with the addr1 signal to connect this buffer to the decoder 240 for data decoding. The addr2 signal is provided to the buffer EDBF2 to transmit to the CPU 300 the data decoded in the previous decoding cycle. In the next decoding cycle, the EDBF2, EDBF0 and EDBF1 will be respectively connected to the ODD 400, decoder 240 and CPU 300.

Thus, the address generator 260 enables the CPU 300, ODD 400, encoder 220 and decoder 240 to access the working buffers EDBF0–EDBF2 rotated during encoding and decoding procedures. The elements of the address generator 260 and their operation will be discussed in more detail later.

The following modes of addressing for various optical disk formats should be provided to support data encoding and decoding operations:

1. linear addressing from location 0 of a working buffer (shown for example in FIG. 3) to location 515, 525 or 1035 of the buffer depending on the disk format, to support data input from the ODD 400 for decoding, 2. linear addressing from location 0 to location 515, 525 or 1035 of the buffer depending on the disk format, to support data input from the CPU 300 for encoding, 3. linear addressing from location 0 to location 515, 525 or 1035 of the buffer depending on the disk format, to support data output to the ODD 400 after encoding, 4. linear addressing from location 0 to location 515, 525 or 1035 of the buffer depending on the disk format, to support data output to the CPU 300 after decoding, 5. interleaving addressing from location 0 to each fifth location (locations 5, 10, 15, 20, . . . ) of the buffer to support RS/CRC encoding for the 90 mm/0.5K and 130 mm/0.5K formats, 6. interleaving addressing from location 0 to each tenth locations (locations 10, 20, 30, . . . ) of the buffer, to support RS/CRC encoding for the 90 mm/1K and 130 mm/1K formats, 7. interleaving addressing from location 0 to each fifth location (locations 5, 10, 15, 20, . . . ), of the buffer to support RS/CRC decoding for the 90 mm/0.5K and 130 mm/0.5K formats, 8. interleaving addressing from location 0 of each buffer to each tenth locations (locations 10, 20, 30, . . . ) of the same buffer, to support RS/CRC decoding for the 90 mm/1K and 130 mm/1K formats, 9. random and linear addressing to each of locations 1200–1216 of each buffer, to support erasure decoding, 10. random and interleaving addressing to write 16 bytes to the end of each codeword, to support syndrome writing during Read-Solomon encoding, 11. random and linear addressing to four CRC bytes, to support CRC reading/writing during CRC encoding/decoding, and 12. random addressing to any buffer location to read, modify and write an error, to support error correction.

The encoding operations are disclosed in more detail in U.S. Pat. No. 5,383,204 entitled "PARALLEL ENCODING METHOD IMPLEMENTING READ SOLOMON CODES AND CYCLIC REDUNDANCY CHECK" issued Jan. 17, 1995 to the inventors of the present application and incorporated herewith by reference. The decoding operations are disclosed in more detail in copending U.S. patent application Ser. No 08/192,909, entitled "FINITE FIELD POLYNOMIAL PROCESSING MODULE FOR ERROR CONTROL CODING" filed Feb. 7, 1994 and incorporated herewith by reference.

Figure 10:
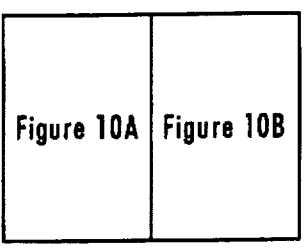
FIG. 10 is a flow chart illustrating address generator operations.
Figure 10A:
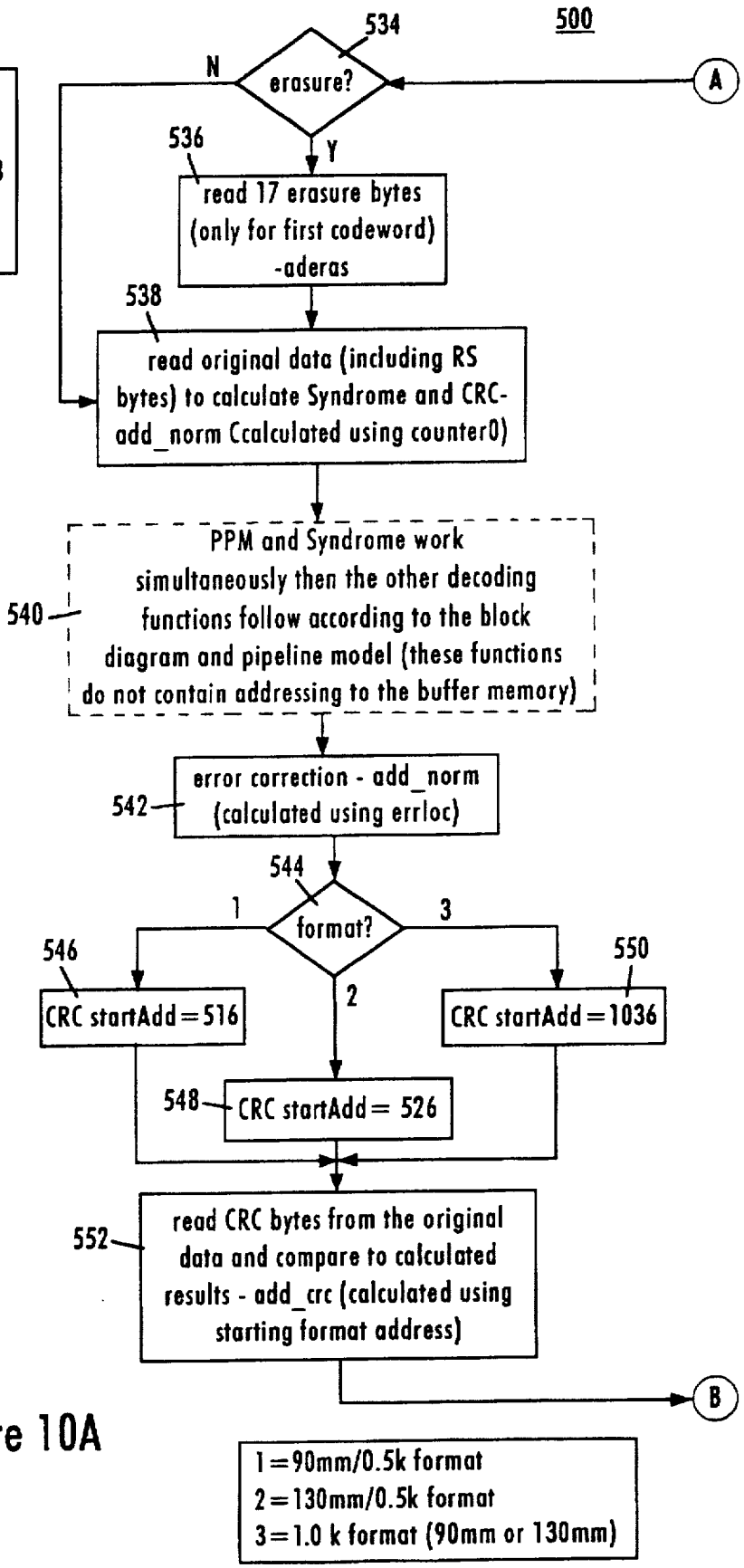
Figure 10B:
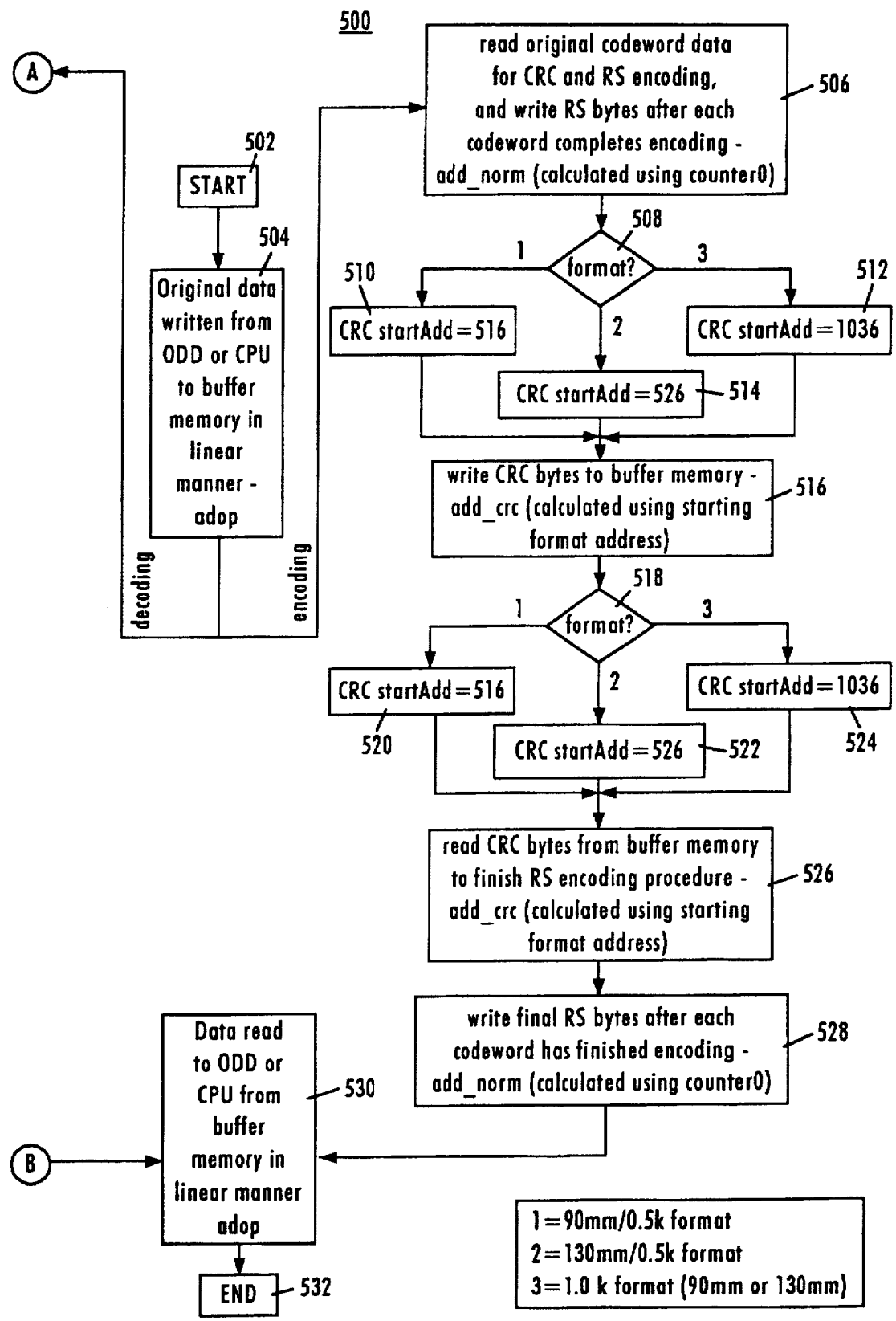

Reference is now made to FIG. 10 showing a flow chart 500 that illustrates the operations of the address generator 250 to provide the above-described addressing modes 1–12. In step 502, the address generator 260 determines whether an encoding or decoding procedure is to be carried out. In step 504, when data are supplied from the CPU 300 (for encoding) or from the ODD 400 (for decoding) to one of the working buffers EDBF0–EDBF2, the address generator 260 performs linear addressing in the mode 2 or mode 1, respectively, described above. More specifically, the loading address generator 262 comprises a linear counter that sequentially counts the number of buffer locations from location 0 to location 515 (for the 90 mm/0.5K disk format), location 525 (for the 130 mm/0.5K format), or location 1035 (for the 90 mm/1K and 130 mm/1K formats), to generate the adop address signal indicating the location in the buffer EDBF to be accessed by the CPU 300 or ODD 400.

If an encoding procedure is carried out, in step 506, the address generator 260 rotates the buffer EDBF that received data from the CPU 300 to connect this buffer to the encoder 220 for RS/CRC encoding. For the 90 mm/0.5K and 130 mm/0.5K formats, the address generator 260 performs interleaving addressing in mode 5. For the 90 mm/1K and 130 mm/1K formats, interleaving addressing in mode 6 is carried out. After each codeword is encoded, the encoder 220 writes RS bytes to the end of the codeword. The address generator 260 provides random and interleaving addressing in the mode 10 to support these encoding operations. The interleaving addressing and random addressing in step 506 are achieved using an add_norm address signal generated in the processing address generator 264 discussed in more detail later.

In step 508, the disk format is detected to set a starting address to write CRC bytes. For the 90 mm/0.5K format, location 516 of the buffer (FIG. 3) is selected as the starting address (step 510). For the 130 mm/0.5K format, the starting address is set to location 526 (step 512). For the 90 mm/1K and 130 mm/1K formats, location 1036 of the buffer is selected as the starting address (step 514).

In step 516, the encoder 220 writes four CRC bytes into the buffer. In the processing address generator 264, an add_crc address signal is generated based on the starting address for a selected disk format, to provide random and linear addressing in the mode 11 that supports CRC writing.

In step 518, the disk format is determined to set a starting address for completing RS encoding. For the 90 mm/0.5K format, location 516 of the buffer (FIG. 3) is selected as the starting address (step 520). For the 130 mm/0.5K format, the starting address is set to location 526 (step 522). For the 90 mm/1K and 130 mm/1K formats, location 1036 of the buffer is selected as the starting address (step 524).

In step 526, the encoder 220 reads CRC bytes from the buffer to finish the RS encoding procedure. To support these operations, the add_crc signal generated in the processing address generator 264 based on the selected starting address is used to provide random and linear addressing in the mode 11.

In step 528, the encoder 220 writes final RS bytes after each encoded codeword. To provide random and interleaving addressing in the mode 10 that supports these operations, the add_norm signal is generated in the processing address generator 264.

In step 530, the address generator 260 rotates the buffer to connect it to the ODD 400 for outputting the encoded data. Data transfer to the ODD 400 is supported by linear addressing in the mode 3 provided using the adop signal generated by the loading address generator 262. As discussed above, the linear counter in the loading address generator sequentially counts buffer locations from 0 to 515, 525, or 1035 depending on the disk format. In step 532, the address generator 260 is ready for encoding data for the next sector of the disk.

If a decoding procedure is carried out, in step 504 data are supplied from the ODD 400 to one of the working buffers EDBF. The adop signal is generated to provide linear addressing in the mode 1.

In step 534, the address generator 260 rotates the buffer that received data from the ODD 400 to connect this buffer to the decoder 240 for data decoding. If any erasure bytes are detected, the address generator 260 goes to the random and linear addressing mode 9 that supports an erasure loading procedure performed by the decoder 240 to read 17 erasure bytes in the first codeword (step 536). In the mode 9, the address generator 260 indicates addresses to access locations 1200 to 1216 of the buffer used for storing the erasure bytes. As discussed in more detail later, an aderas signal is generated in the processing address generator 264 to support decoding in an erasure mode.

If no erasure bytes are detected in step 534, or the erasure loading operations are finished, the address generator 260 goes to step 538 that supports RS/CRC decoding performed by the decoder 240. The processing address generator 264 generates the add_norm signal that allows interleaving addressing to be provided. For the 90 mm/0.5K and 130 mm/0.5K formats, the address generator 260 performs interleaving addressing in mode 7. For the 90 mm/1K and 130 mm/1K formats, interleaving addressing in mode 8 is carried out.

In step 540, the decoder 240 performs pipeline decoding operations. These operations disclosed in more detail in copending U.S. patent application Ser. No 08/192,909, entitled "FINITE FIELD POLYNOMIAL PROCESSING MODULE FOR ERROR CONTROL CODING" filed Feb. 7, 1994, do not require addressing to the buffer.

In step 542, error correction operations are performed by the decoder 240 to correct errors in each decoded codeword. The address generator 260 provides random addressing in the mode 12 to support these operations. To provide addressing in the mode 12, a correction count supplied to the processing address generator 264 during the error correction operations is used to generate the add_norm signal in the processing address generator 264.

In step 544, the disk format is determined to set a starting address for CRC reading operations, when the decoder 240 reads CRC bytes from the original data to compare them to calculated results. For the 90 mm/0.5K format, location 516 of the buffer (FIG. 3) is selected as the starting address (step 546). For the 130 mm/0.5K format, the starting address is set to location 526 (step 548). For the 90 mm/1K and 130 mm/1K formats, location 1036 of the buffer is selected as the starting address (step 550). In step 552, the add_crc signal is formed in the processing address generator 264 based on the selected starting address, to provide random addressing in mode 11 that supports the CRC reading operations.

Thereafter, the address generator 260 goes to step 530. During a decoding procedure, this step includes the rotation of the buffer from the decoder 240 to the CPU 300. Then, linear addressing in the mode 4 is carried out using the adop signal to support the transfer of the decoded data to the CPU 300. As discussed above, the linear counter in the loading address generator 262 sequentially counts buffer locations from location 0 to location 515 (for the 90 mm/0.5K disk format), location 525 (for the 130 mm/0.5K format), or location 1035 (for the 90 mm/1K and 130 mm/1K formats), to generate the adop address signal indicating the locations in the buffer to be accessed by the CPU 300. In step 532, the address generator 260 is ready for decoding data from the next sector of the disk.

Figure 11:
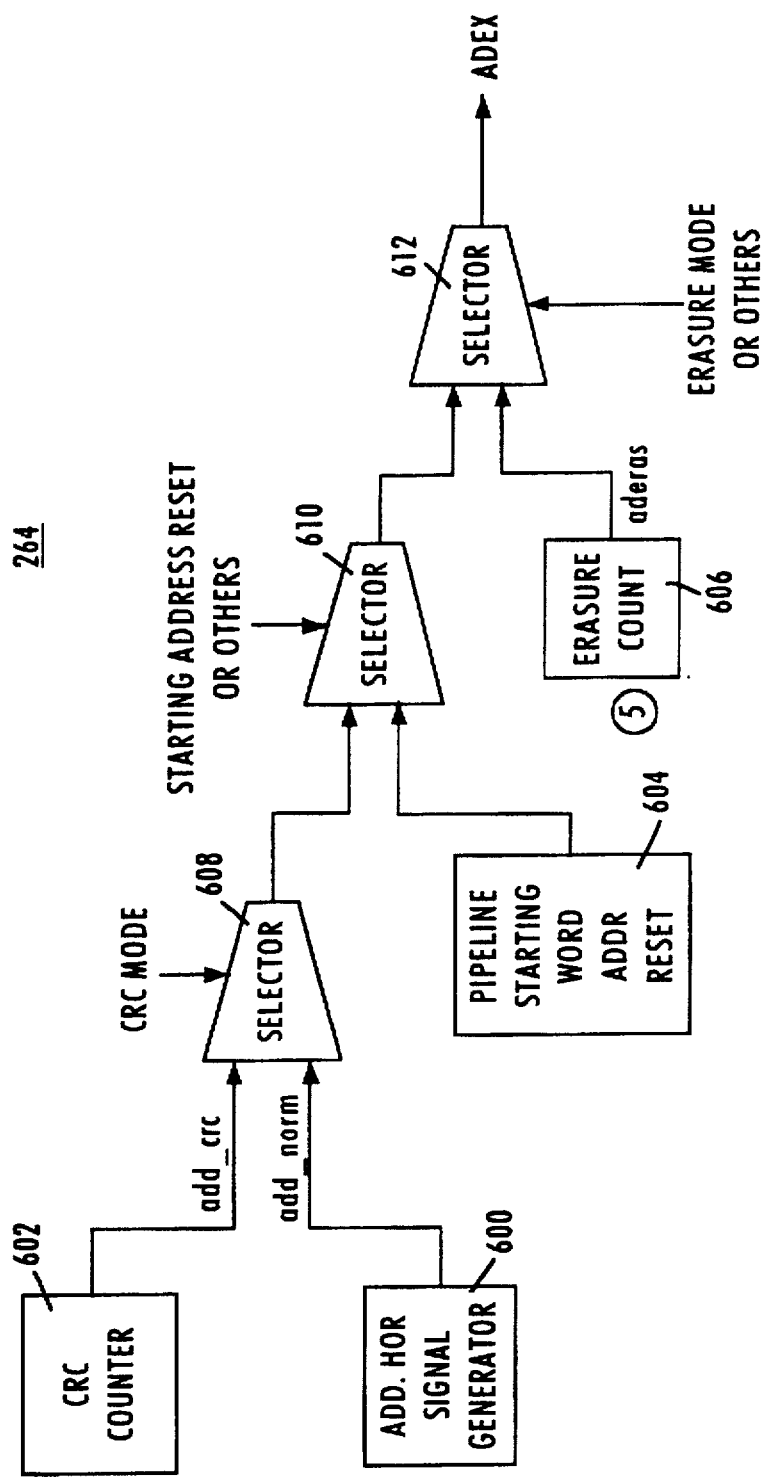
FIG. 11 is a block diagram of a processing address generator.

Reference is now made to FIG. 11 illustrating the processing address generator 264 that generates the adex signal based on the add_norm, add_crc and aderas signals described above. As shown in FIGS. 8 and 9, the adex signal is supplied to the multiplexers 268A, 268B and 268C to generate address signals that allow the CPU 300, ODD 400, encoder 220 and decoder 240 to access the buffers EDBF0–EDBF2.

The processing address generator 264 comprises an add_norm signal generator 600, a CRC counter 602 that generates the add_crc signal, a pipelining starting word address reset circuit 604, an erasure counter 606 that generates the aderas signal, and selectors 608, 610 and 612. The add_norm signal generator 600 generates the add_norm signal used to support RS/CRC encoding and decoding. Its structure and operations are discussed in more detail later. The CRC counter 602 sets a starting address for various disk formats (in steps 510–514, 520–524 and 546–550 in FIG. 10), and provides counts corresponding to the buffer locations to be randomly accessed for reading and writing CRC bytes in steps 516, 526, and 552 in FIG. 10. The pipelining starting word address reset circuit 604 generates a reset signal at the beginning of each codeword being encoded or decoded in steps 506, 528, and 538 in FIG. 10. The erasure counter 606 provides counts that indicate locations of erasure bytes read in step 536 in FIG. 10. The adex signal is supplied from the output of the selector 612.

The add_crc and add_norm signals are supplied to the selector 608 controlled by a CRC mode signal that becomes active when a CRC encoding or decoding procedure is carried out. When the CRC mode signal is active, the add_crc signal passes through the selector 608. Otherwise, the add_norm signal is formed at the output of the selector 608.

The output of the selector 608, together with a pipelining reset signal formed by the pipelining starting word address reset circuit 604, is supplied to the selector 610 controlled by a starting address reset signal that becomes active after each codeword is encoded or decoded to pass the pipelining reset signal from the circuit 604 to the output of the selector 608. When the starting address reset signal is not in an active state, the output signal of the selector 608 passes to the output of the selector 610. The selector 612 controlled by an erasure mode signal receives the aderas signal from the erasure counter 606, together with the output signal of the selector 610. When the erasure mode signal becomes active to indicate that an erasure mode of decoding is carried out, the aderas signal is supplied to the output of the selector 612. Otherwise, the output signal of the selector 610 passes to the output of the selector 612 that forms the adex signal. Thus, the adex signal may be represented by either the add_norm signal, add_crc signal, aderas signal or pipelining reset signal, depending on the status of the control signals supplied to the selectors 608, 610 and 612 from the encoder 220 or decoder 240.

Figures 12, 13:
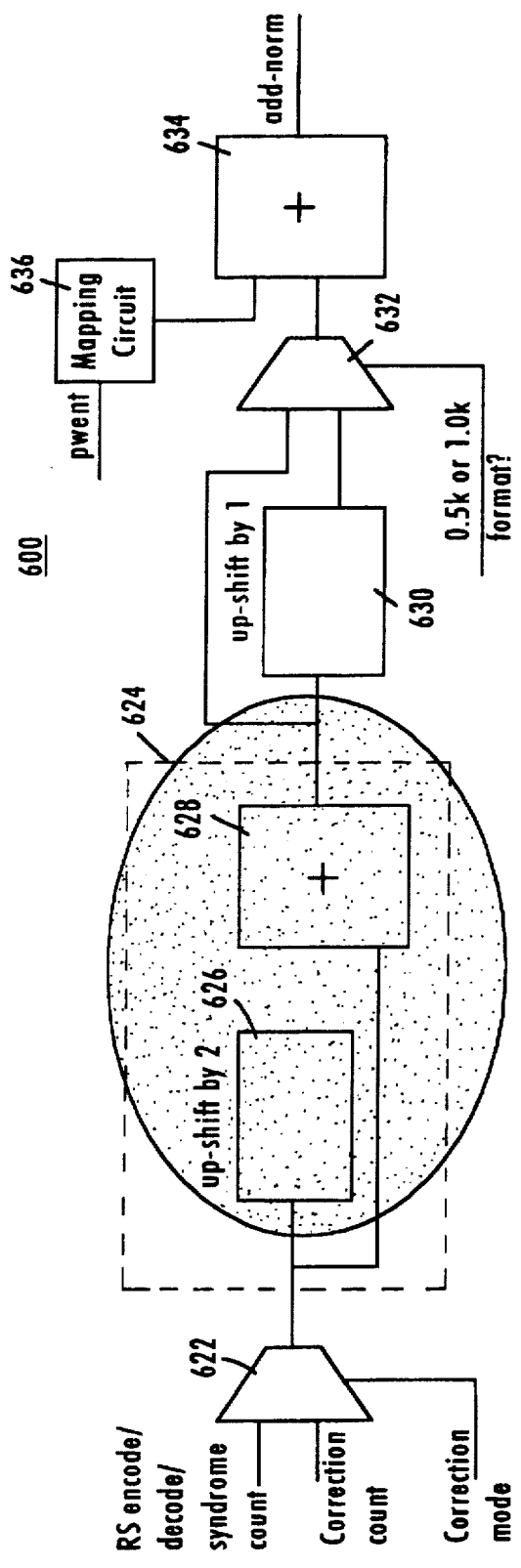
FIG. 12 is a block diagram of an add_norm signal generator.
FIG. 13 is a diagram illustrating mapping function performed in the add_norm signal generator.

Referring to FIG. 12, the add_norm signal generator 600 comprises a selector 622 supplied with an RS encode/decode/syndrome count and with a correction count. The encode/decode/syndrome counts are provided by RS encoding or decoding circuitry when steps 506 and 538 in FIG. 10 are carried out to indicate cycles of RS encoding/decoding and syndrome generation. The correction counts are provided by the decoder 240 in a correction mode, when the decoded codeword is corrected (step 542 in FIG. 10) to indicate cycles of error correction. The selector 622 is controlled by a correction mode signal that becomes active when the correction mode is carried out to pass the correction count to the output of the selector 622. If the correction mode signal is not active, the encode/decode/syndrome count is supplied to the output of the selector 622.

The output signal of the selector 622 is supplied to a multiplier 624 that performs multiplication by 5. The multiplier 624 comprises a shift register 626 that provides up-shift by 2, and an adder 628 having a first input supplied by the shift register 626 and a second input connected to the output of the selector 622. The output signal of the multiplier 624 is supplied to a shift register 630 that provides up-shift by 1 to multiply its input value by 2.

The output of the register 630 is coupled to one input of a selector 632 having its another input connected to the output of the multiplier 624. The selector 632 is controlled by a select format signal that indicates whether the 0.5K or 1K disk format is used. If the 0.5K format is indicated, the output signal of the multiplier 624 passes to the output of the selector 632 to skip 5 buffer locations when interleaving addressing is provided. If the 1K disk format is used, the output signal of the register 630 passes to the output of the selector 632 to provide interleaving addressing with 10 buffer locations skipped.

The output of the selector 632 is supplied to one input of an adder 634 having its another input connected to a mapping circuit 636 that matches pwcnt counts of a word counter arranged in the encoder/decoder logic 220 and 240, with an actual word being encoded or decoded. As illustrated, for example, in FIG. 3, the word counter provides pwcnt counts that tract words supplied for encoding or decoding. However, for the 90 mm/1K and 130 mm/1K disk formats, data in each sector buffer are organized in 10 words 0–9, whereas for the 90 mm/0.5K and 130 mm/0.5K disk formats, data in the sector buffer are arranged in 5 words 0–4. To avoid using separate word counters for each disk format, the mapping circuit 636 generates wdcnt(1.0) counts for the 90 mm/1K and 130 mm/1K disk formats, and wdcnt(0.5) counts for the 90 mm/0.5K and 130 mm/0.5K disk formats, based on the pwcnt counts supplied to the address generator 260. The wdcnt(1.0) and wdcnt(0.5) counts define the number of a word being actually encoded or decoded for a selected disk format. Also, the mapping circuit 636 generates wdcorr counts that define the number of a word being processed by an error correcting circuit in the decoder 240 during an error correction mode of decoding.

A mapping function performed by the mapping circuit 636 is illustrated in FIG. 13. The mapping circuit 636 is supplied with a set of pwcnt counts 0–13, which define corresponding values of wdcnt (1.0), wdcnt (0.5) and wdcorr counts. In a table shown in FIG. 13, each pwcnt count in a row is followed by the wdcnt(1.0), wdcnt(0.5) and wdcorr counts assigned to the pwcnt count. For example, if the mapping circuit 636 is supplied with pwcnt count 7, it generates wdcnt(1.0) count 7, wdcnt(0.5) count 3, or wdcorr count 4. The mapping circuit 636 is provided with control signals that indicate a disk format and a correction mode to select which of the counts should be generated.

The adder 634 adds the count value produced by the mapping circuit 636 to the output value of the selector 632 to generate the add_norm signal. As discussed above, the processing address generator 264 uses the add_norm signal, together with add_crc, aderas and pipelining reset signals, to produce the adex address signal that indicates locations in the working buffers EDBF0–EDBF2 to be accessed by the encoder 220 and decoder 240 during encoding and decoding. The linear counter in the loading address generator 262 sequentially counts locations of the working buffers to provide the adop address signal that indicates locations in the working buffers sequentially accessed by the CPU 300 and ODD 400.

The adex and adop address signals are respectively supplied to first and second inputs of each of the address multiplexers 268A, 268B, 268C (FIGS. 12 and 13) that provide the working buffers EDBF0, EDBF1 and EDBF2 with the addr0, addr1 and addr2 address signals, respectively. The address multiplexers 268A, 268B and 268C, together with the data bus multiplexing circuit 270, are controlled by the EDBF rotation control circuit 266 to rotate the working buffers EDBF0–EDBF2 during encoding and decoding.

Figure 14:
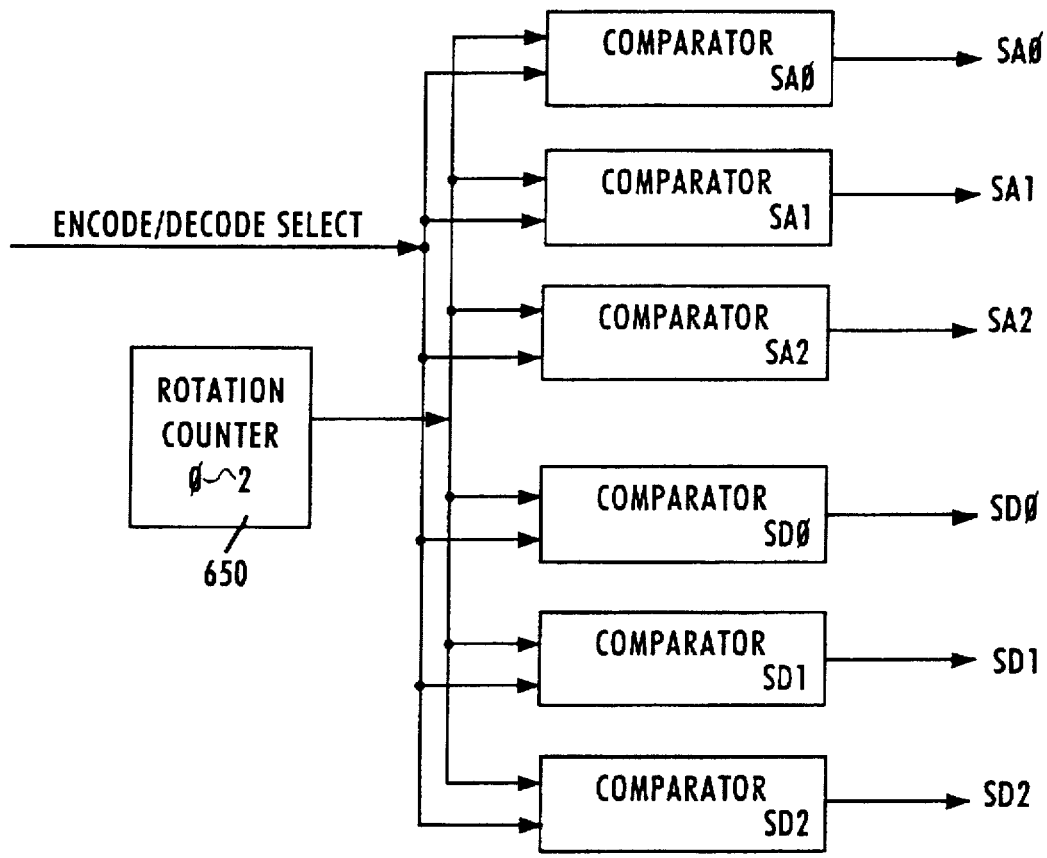
FIG. 14 is a block diagram of an EDBF rotation control circuit.

As shown in FIG. 14, the EDBF rotation control circuit 266 comprises a rotation counter 650 that provides rotation counts 0, 1 and 2 to define cycles of buffer rotation. The rotation counts are supplied to first inputs of comparators SA0, SA1, SA2, SD0, SD1, and SD2 having their second inputs provided with an encode/decode select signal that indicates whether encoding or decoding is carried out. During encoding operations, the encode/decode select signal is represented by 1. During decoding operations, the encode/decode select signal is set to 0.

Figure 15:
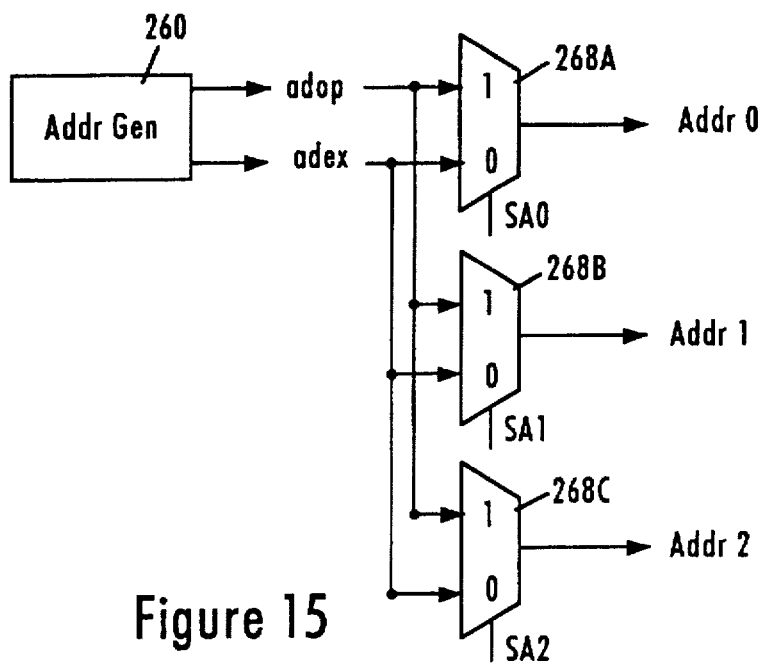
FIG. 15 is a block diagram illustrating an address multiplexer control arrangement.

Based on the rotation counts and the encode/decode select signal, the comparators SA0, SA1, and SA2 respectively generate SA0, SA1, and SA2 address control signals supplied to control inputs of the address multiplexers 268A, 268B and 268C (FIG. 15) to produce the addr0, addr1, and addr2 address signals that represent either the adop signal or adex signal. If an address control signal SAi is equal to 1, the adop address signal is generated at the output of the corresponding address multiplexer, if the address control signal SAi is set to 0, the adex signal is produced, where i=0, 1, 2.

Figure 16:
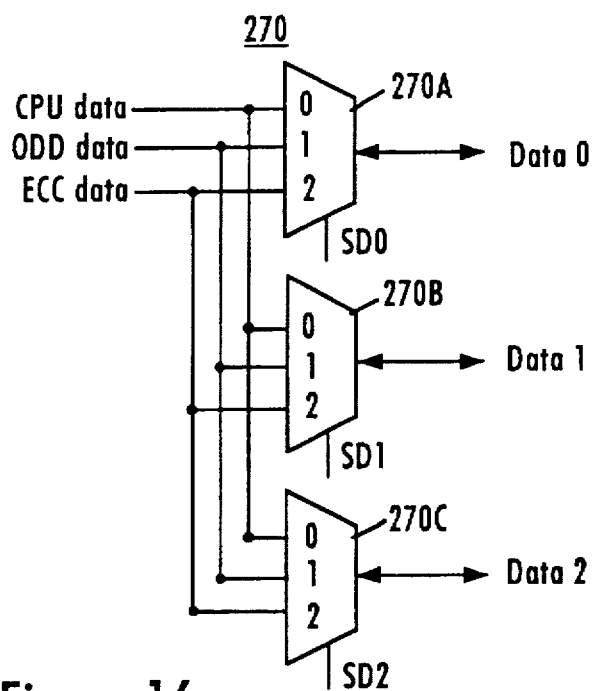
FIG. 16 is a block diagram illustrating a data bus multiplexer control arrangement.

The comparators SD0, SD1 and SD2 respectively generate SD0, SD1, and SD2 data bus control signals supplied to control inputs of the data bus multiplexing circuit 270. As shown in FIG. 16, the data bus multiplexing circuit 270 comprises data bus multiplexers 270A, 270B and 270C having their outputs coupled to bidirectional data buses Data0, Data1 and Data2 connected to the working buffers EDBF0, EDBF1 and EDBF2, respectively. Each of the data bus multiplexers 270A, 270B and 270C has three inputs, first of which is connected to CPU data bus coupled to the CPU 300, second is connected to ODD data bus coupled to the ODD 400, and third is connected to ECC data bus coupled to the encoder 220 and decoder 240. Control inputs of the data bus multiplexers 270A, 270B and 270C are respectively supplied with the SD0, SD1 and SD2 data bus control signals that control the connections of the Data0, Data1 and Data2 buses to the CPU, ODD and ECC data buses. In particular, if a SDi data bus control signal is set to 0, a Datai bus coupled to an EDBFi buffer is connected to the CPU data bus; if the SDi data bus control signal is set to 1, the Datai bus is connected to the ODD data bus; if the SDi data bus control signal is set to 2, the Datai bus is coupled to the ECC data bus, where i=0, 1, 2.

Buffer rotation provided by the address and data bus multiplexers in response to the address control signals SA0, SA1 and SA2, and the data bus control signals SD0, SD1 and SD2 during encoding and decoding procedures is illustrated in tables shown in FIGS. 17 and 18. For example, during encoding cycle 0 (defined by the encode/decode select signal equal to 1, and rotation count 0) the address control signals SA0, SA1 and SA2 cause the adop address signals to be supplied to the EDBF0 and EDBF1 buffers, and the adex address to be sent to the EDBF2. At the same time, the data bus control signals SD0, SD1 and SD2 are set to 0, 1 and 2, respectively, to provide the connection of the EDBF0 buffer to the CPU 300, the connection of the EDBF1 buffer to the ODD 400, and the connection of the EDBF2 buffer to the encoder 220 in the ECC 200. During the next encoding cycle 1, the address control signals SA0, SA1 and SA2 provide the EDBF0, EDBF1 and EDBF2 buffers with the adex, adop and adex address signals, respectively. At the same time, the data bus control signals SD0, SD1 and SD2 are set to 2, 0 and 1, respectively, to couple the EDBF0 buffer to the encoder 220 in the ECC 200, to connect the EDBF1 buffer to the CPU 300, and to connect the EDBF2 buffer to the ODD 400. During encoding cycle 2, the address control signals SA0, SA1 and SA2 enable the EDBF0, EDBF1 and EDBF2 buffers to receive the adop, adex and adop address signals, respectively. At the same time, the data bus control signals SD0, SD1 and SD2 are set to 1, 2 and 0, respectively, to connect the EDBF0, EDBF1 and EDBF2 buffers to the ODD 400, the encoder 220 in the ECC 200, and the CPU 300.

When the encode/decode select signal is set to 0, and the rotation counter 650 produces count 1, decoding cycle 0 is carried out. During this cycle, the address control signals SA0, SA1 and SA2 cause the adop address signals to be supplied to the EDBF0 and EDBF1 buffers, and the adex address to be sent to the EDBF2. At the same time, the data bus control signals SD0, SD1 and SD2 are set to 0, 1 and 2, respectively, to provide the connection of the EDBF0 buffer to the CPU 300, the connection of the EDBF1 buffer to the ODD 400, and the connection of the EDBF2 buffer to the decoder 240 in the ECC 200. During the next decoding cycle 1, the address control signals SA0, SA1 and SA2 provide the EDBF0, EDBF1 and EDBF2 buffers with the adop, adex and adop address signals, respectively. At the same time, the data bus control signals SD0, SD1 and SD2 are set to 1, 2 and 0, respectively, to couple the EDBF0 buffer to the ODD 400, to connect the EDBF1 buffer to the decoder 240 in the ECC 200, and to connect the EDBF2 buffer to the CPU 300. During decoding cycle 2, the address control signals SA0, SA1 and SA2 enable the EDBF0, EDBF1 and EDBF2 buffers to receive the adex, adop and adop address signals, respectively. At the same time, the data bus control signals SD0, SD1 and SD2 are set to 2, 0 and 1, respectively, to connect the EDBF0, EDBF1 and EDBF2 buffers to the decoder 240 in the ECC 200, the CPU 300, and the ODD 400.

There accordingly has been described an address generator provided on an error control chip of an optical disk storage for addressing a plurality of working buffers accessed by a CPU, an optical disk drive (ODD), and encoder/decoder circuitry during error correction operations. The address generator comprises a loading address generator that produces an adop address signal to provide linear buffer access for the CPU and ODD when data are supplied from and to the CPU and ODD for encoding and decoding. A processing address generator produces an adex address signal that provides interleaving and random buffer access for the encoder/decoder circuitry during data encoding and decoding operations. A buffer rotation control circuit produces address and data bus control signals to provide the rotation of the buffers between the CPU, ODD, and encoder/decoder circuitry in various encoding and decoding cycles to support a pipeline error control arrangement.

In this disclosure, there are shown and described only the preferred embodiments of the invention, but it is to be understood that the invention is capable of changes and modifications within the scope of the inventive concept as expressed herein.

We claim:

1. A system for correcting errors in a disk storage, comprising:
    an encoder for encoding original data supplied from a central processor for storing in said disk storage,
    a decoder for decoding data read by a disk drive from said disk storage,
    a plurality of working buffers accessible by said central processor, disk drive, encoder and decoder, and
    an address generator for addressing said plurality of working buffers to enable each of said central processor, disk drive, encoder and decoder to access a predetermined one of said plurality of working buffers.

2. The system of claim 1, wherein said address generator comprises a buffer rotation circuit for rotating said plurality of working buffers to allow each of said central processor, disk drive, encoder and decoder to sequentially access all of said plurality of working buffers.

3. The system of claim 2, wherein said address generator further comprises a loading address generator for providing said central processor and said disk drive with linear access to locations of the working buffers.

4. The system of claim 3, wherein said address generator further comprises a processing address generator for providing said encoder and decoder with interleaving and random access to locations of the working buffers.

5. The system of claim 4, further comprising an address multiplexing circuit including a plurality of address multiplexers coupled to said plurality of working buffers.

6. The system of claim 5, wherein a first input of each of said plurality of address multiplexers is connected to said loading address generator, and a second input of each of said plurality of address multiplexers is connected to said processing address generator.

7. The system of claim 6, wherein said plurality of address multiplexers are controlled by said buffer rotation circuit.

8. The system of claim 7, further comprising a data bus multiplexing circuit having inputs connected to said plurality of working buffers and outputs coupled to said central processor, disk drive, encoder and decoder.

9. The system of claim 8, wherein said data bus multiplexing circuit is controlled by said buffer rotation circuit.

10. The system of claim 9, wherein said buffer rotation circuit comprises a plurality of comparators supplied by rotation counts and an encoding/decoding select signal.

11. The system of claim 4, wherein said processing address generator comprises a mapping circuit for indicating a word being processed by said encoder and decoder for disks of various formats, based on a unified word count supplied to said encoder and decoder.

12. An error control chip for correcting errors in an optical disk storage, comprising:

encoder/decoder circuitry for encoding original data provided by a central processor for storing in said optical disk storage, and for decoding stored data read by an optical disk drive from said disk storage, encoded data being supplied to an optical disk drive, and decoded data being supplied to said central processor, first, second and third working buffers for storing data during an encoding/decoding procedure, and an address generator for providing each of said central processor, disk drive, and encoder/decoder circuitry with an access to one of said first, second and third working buffers in each cycle of the encoding/decoding procedure.

13. The chip of claim 12, wherein said address generator comprises a buffer rotation circuit for sequentially connecting each of said first, second and third working buffers to each of said central processor, disk drive, and encoder/decoder circuitry.

14. The chip of claim 13, wherein said address generator further comprises a loading address generator for providing said central processor with an access to each of said first, second and third working buffers for supplying said original data, and reading said decoded data.

15. The chip of claim 14, wherein said loading address generator further provides said optical disk drive with an access to each of said first, second and third working buffers for receiving said encoded data to be written on said optical disk, and for supplying said stored data read out from said optical disk.

16. The chip of claim 15, wherein said loading address generator provides linear addressing of said working buffers.

17. The chip of claim 16, wherein said address generator further comprises a processing address generator for providing said encoder/decoder circuitry with an access to each of said first, second and third working buffers for data encoding and decoding.

18. The chip of claim 17, wherein said processing address generator provides interleaving and random addressing of said working buffers.

19. The chip of claim 17, wherein said processing address generator comprises a first circuit for multiplying by a first value including an adder and a first shift register coupled to an input of said adder.

20. The chip of claim 19, wherein said processing address generator further comprises a second circuit for multiplying by a second value having a second shift register coupled to the output of said adder.

21. The chip of claim 20, wherein said processing address generator further comprises a format selector having a first input coupled to said adder, and a second input coupled to said second shift register.

22. The chip of claim 21, wherein said format selector has a select format output, and a control input controlled by a select format signal to couple said select format output to the output of said adder when a first format of said optical disk storage is selected, and to couple said select format output to an output of said second shift register when a second format of said optical disk storage is selected.

23. A method of encoding comprising the steps of:

supplying a first working buffer with a first data block to be encoded, encoding a second data block stored in a second working buffer, outputting an encoded third data block stored in a third working buffer, rotating the first, second and third working buffers for supplying the third working buffer with a fourth data block to be encoded, encoding the first data block stored in the first working buffer, and outputting the encoded second data block from the second working buffer, and further rotating the first, second and third working buffers for supplying the second working buffer with a fifth data block to be encoded, encoding the fourth data block stored in the third working buffer, and outputting the encoded first data block from the first working buffer.

24. A method of decoding comprising the steps of:

supplying a first working buffer with a first data block to be decoded, decoding a second data block stored in a second working buffer, outputting a decoded third data block stored in a third working buffer, rotating the first, second and third working buffers for supplying the third working buffer with a fourth data block to be decoded, decoding the first data block stored in the first working buffer, and outputting the decoded second data block from the second working buffer, and further rotating the first, second and third working buffers for supplying the second working buffer with a fifth data block to be decoded, decoding the fourth data block stored in the third working buffer, and outputting the decoded first data block from the first working buffer.

* * * * *